United States Patent [19]
Lee et al.

[11] Patent Number: 5,693,558
[45] Date of Patent: Dec. 2, 1997

[54] METHOD FOR FABRICATING A LASER DIODE

[75] Inventors: Soo Won Lee; Gyu Seog Cho; Tae Jin Kim; Kyung Seok Oh, all of Kyoungkido, Rep. of Korea

[73] Assignee: Hyundai Electronics Industries Co., Ltd., Rep. of Korea

[21] Appl. No.: 756,566

[22] Filed: Nov. 26, 1996

[30] Foreign Application Priority Data

Dec. 29, 1995 [KR] Rep. of Korea .............. 1995-66037

[51] Int. Cl.⁶ .................................................. H01L 21/20
[52] U.S. Cl. ........................ 437/129; 437/107; 437/133
[58] Field of Search .................................. 437/129, 133, 437/107

[56] References Cited

U.S. PATENT DOCUMENTS

| | | | |
|---|---|---|---|
| 5,278,858 | 1/1994 | Brillouet et al. | 372/46 |
| 5,311,534 | 5/1994 | Mori et al. | 372/46 |
| 5,376,581 | 12/1994 | Shimoyama et al. | 437/129 |
| 5,382,543 | 1/1995 | Nakamura et al. | 437/129 |
| 5,499,260 | 3/1996 | Takahashi et al. | 372/46 |
| 5,506,170 | 4/1996 | Yodoshi et al. | 437/129 |
| 5,518,954 | 5/1996 | Yoo et al. | 437/129 |

Primary Examiner—Charles L. Bowers, Jr.
Assistant Examiner—Ramamohan Rao Paladugu
Attorney, Agent, or Firm—Blakely Sokoloff Taylor & Zafman

[57] ABSTRACT

The present invention relates to a method for fabricating a semiconductor laser diode in optical communication system, having the steps for forming current blocking layers on the resulting structure of the mesa structure and then forming an opening through the current blocking layer on the mesa structure.

8 Claims, 5 Drawing Sheets

METHOD FOR FABRICATING A LASER DIODE

FIELD OF THE INVENTION

This invention relates to a method for fabricating a laser diode, and more particularly to a method for fabricating a planar buried heterostructure laser diode("PBH-LD") having improved current blocking layers to decrease leakage current during operation.

BACKGROUND OF THE INVENTION

Generally, in a semiconductor laser diode, in order to achieve reliable device characteristics, for example current confinement, refractive index guide, etc., a mesa structure is useful in consideration of the size of the active layer and the device profile.

The conventional method for fabricating the mesa structured laser diode is described hereinafter with reference to the FIG. 1 to FIG. 4, which illustrate the process flow of the conventional method.

First, referring to FIG. 1, an n-InP clad layer 2, an active layer 3 and a p-inP clad layer 4 is successively formed on an n-InP substrate 1.

Next, referring to FIG. 2, an oxide pattern 5 is formed on the p-InP clad layer 4.

Next, referring to FIG. 3, in order to form the mesa structure, the layers 2, 3 and 4 under the oxide pattern 5 is etched with the oxide pattern 5 being used as an etch mask until a portion of the n-InP clad layer 2 is exposed. In this etching process, an under cut is formed under the edge of the oxide pattern 5.

Next, referring to FIG. 4, a p-InP current blocking layer 6 and an n-InP current blocking layer 7 are selectively formed on the side portion of the mesa structure by metal organic chemical vapor deposition ("MOCVD") or liquid phase epitaxy("LPE"). Then, after removing the oxide pattern 5, a p-contact layer 8 is formed on the resulting structure and a metal contact layer 9 is formed on the p contact layer 8.

However, the above mentioned conventional method for fabricating the mesa structured laser diode has the following problems:

Now, referring to FIG. 3B and FIG. 4B, in case the p-InP current blocking layer 6 on the side portion of the mesa structure is formed broader than that of the above mentioned normal case by various reasons, for example the process variation, there will be a leakage current path 10 through the current blocking layer 6. FIG. 3B is a simplified cross sectional view which illustrates the unwanted broader formation of the current blocking layer 6 due to the process variations of the conventional method.

Referring to FIG. 3B, after the step for forming the oxide characteristics and reliability without the effect of the process variations, by forming current blocking layers on the resulting structure of the mesa structure and then forming an opening, through which currents are injected, in the current blocking layer.

In accordance with the present invention, there is disclosed a method for fabricating a laser diode including the steps for: successively forming a first clad layer, an active layer, a second clad layer and an etch stop layer on a semiconductor substrate; forming an oxide pattern on the etch stop layer; forming a mesa structure by etching a predetermined portion of the layers under the oxide layer from the etch stop layer to a portion of the first clad layer using the oxide pattern as an etch mask; removing the oxide pattern; forming a first and a second current blocking layer on the resulting structure; forming an opening to expose the etch stop layer by etching the current blocking layers with a predetermined photo resist pattern; removing the etch stop layer; forming a first contact layer on the resulting structure; and forming a second contact layer on the first contact layer.

BRIEF DESCRIPTION OF THE DRAWINGS

A further understanding of the nature and advantage of the present invention will become apparent by reference to the remaining portions of the specification and drawings. pattern 5(refer to FIG. 2), a p-InP current blocking layer 6 and an n InP current blocking layer 7, are selectively formed on the side portion of the mesa structure by MOCVD or LPE. In this case, the p-InP current blocking layer 6 is extended to the edge of the oxide pattern 5.

Figure 1:
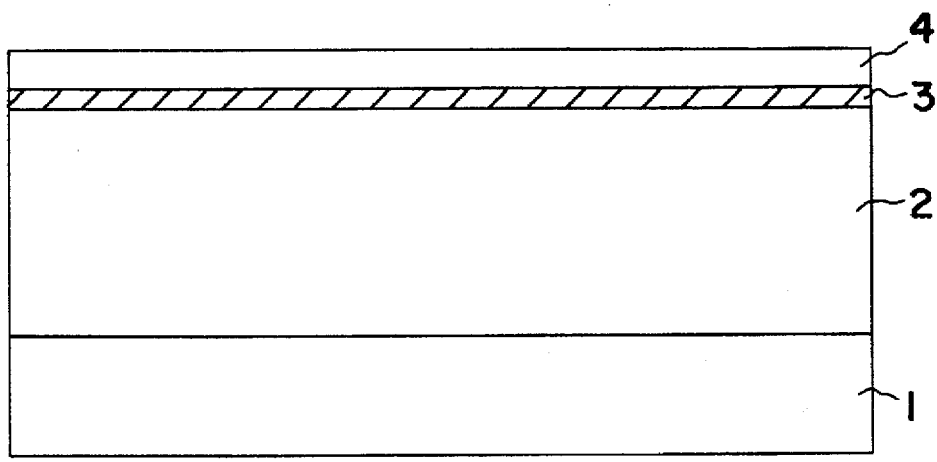
Figure 2:
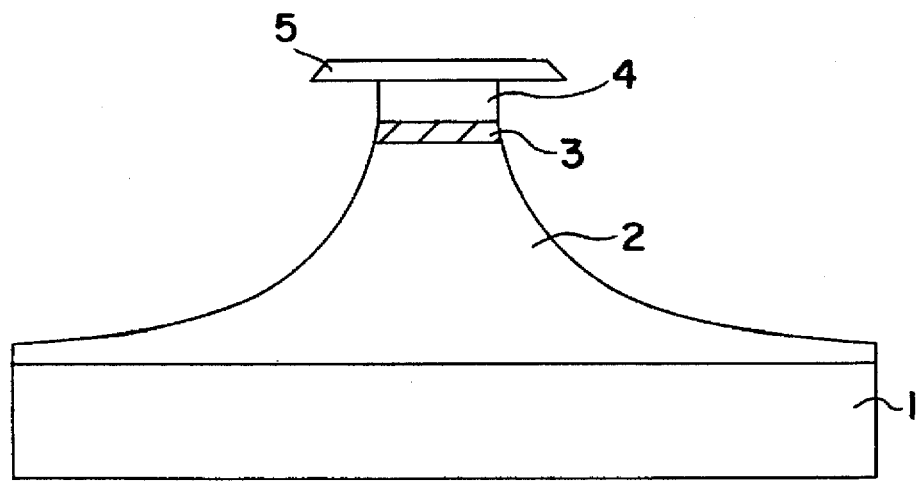

The arrows 10 in the drawing denote the directions of the leakage current flow in the p-InP current blocking layer 6 due to the broader formation which is mentioned above with reference to FIG. 3B. The leakage current also results from the profile of the mesa structure, the size of the under cut and the thickness of the p-contact layer 8. These leakage currents from various sources deteriorate the characteristics, the reliability of the laser diode and the reproducibility of process.

SUMMARY OF THE INVENTION

Therefore, the present invention has been made in view of the above mentioned problem, and the present invention provides a method for fabricating a laser diode having improved device FIGS. 1 to 4 are simplified cross sectional views which illustrate the process flow of the conventional method.

Figure 3A:
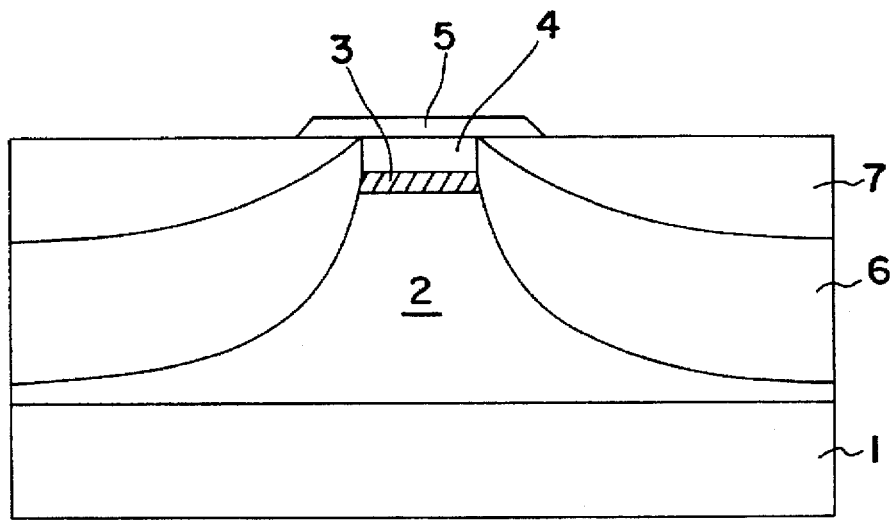
Figure 3B:
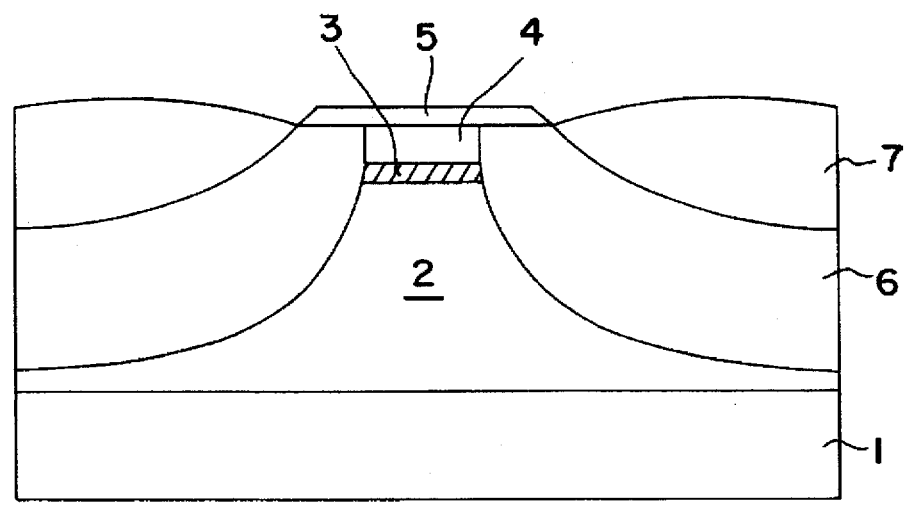

FIG. 3B is a simplified cross sectional view which illustrates the different formation of the current blocking layer by the process variations of the conventional method.

Figure 4A:
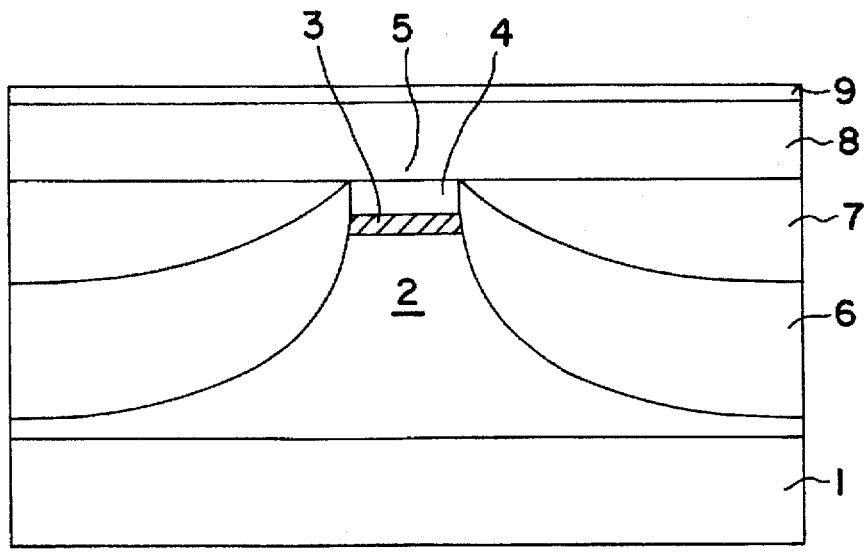
FIG. 4 B is a simplified cross sectional view which illustrates the occurrence of leakage currents through the current blocking layer 6 in FIG. 3B.
Referring to FIG. 4B, after removing the oxide pattern 5, the contact layer 8 is formed on the p InP clad layer 4 and the n-InP current blocking layer 7. Then, the metal contact layer 9 is formed on the p contact layer 8.
Figure 4B:
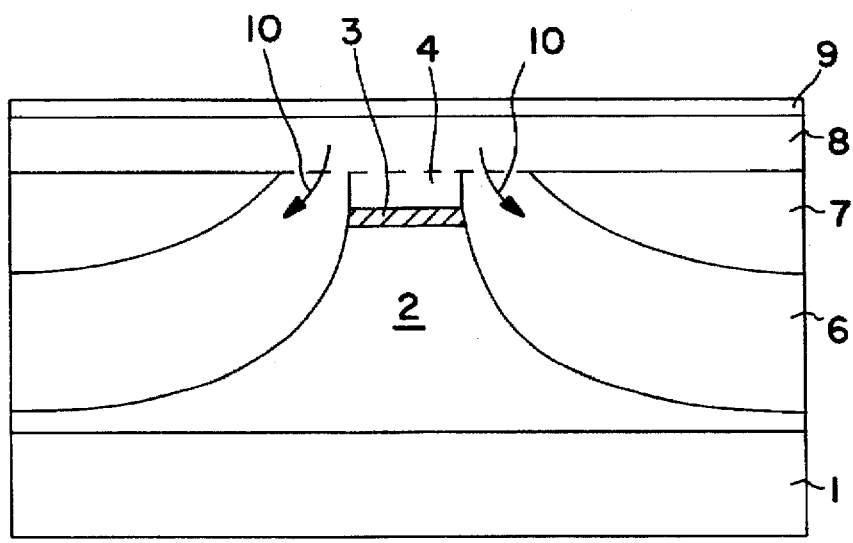

FIG. 4B is a simplified cross sectional view which illustrates the occurrence of leakage currents due to the current blocking layer in FIG. 3B.

FIGS. 5 to 10 are simplified cross sectional views which illustrate the process flow of the method for fabricating a laser diode according to the present invention.

DETAILED DESCRIPTION OF THE PREFERRED EMBODIMENT

A detailed description of an embodiment according to the present invention will be given below with reference to FIGS. 5 to 10.

Figure 5:
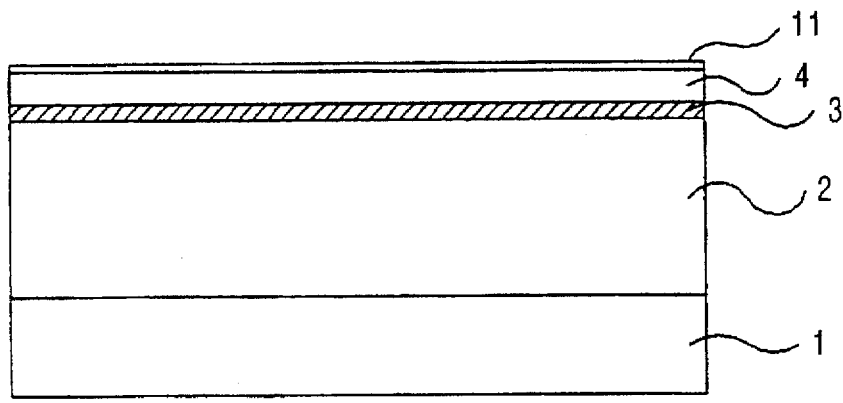

First, referring to FIG. 5, a first clad layer, for example an n-InP clad layer 2, an active layer 3, a second clad layer, for example a p-InP clad layer 4, and an etch stop layer 11 are successively formed on a semiconductor substrate, for example an n-InP substrate 1.

Figure 6:
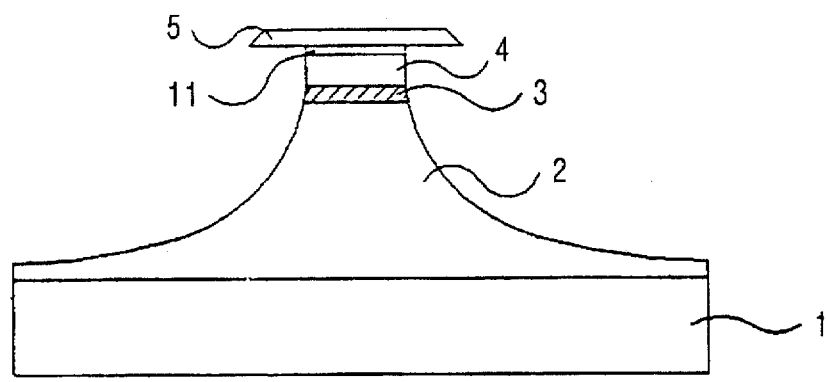

Next, referring to FIG. 6, an oxide pattern 5 is formed on the etch stop layer 11, and a mesa structure is formed by etching a predetermined portion of the layers under the oxide pattern from the etch stop layer 11 to a portion of the n-InP clad layer 2 using the oxide pattern 5 as an etch mask.

Figure 7:
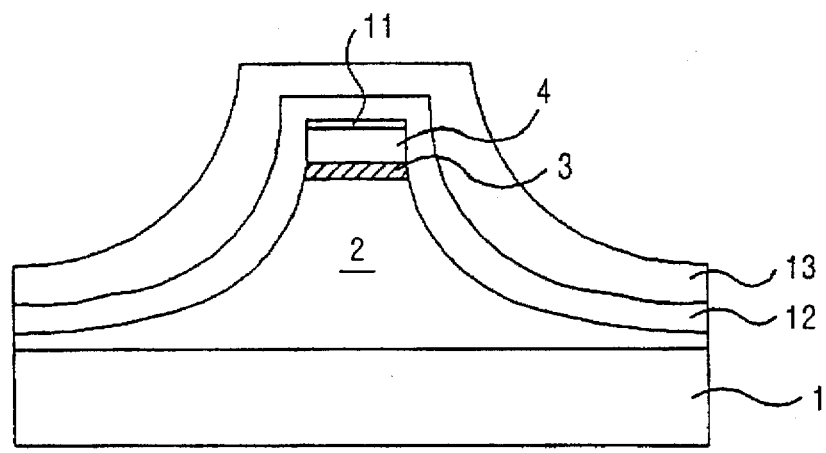

Next, referring to FIG. 7, after removing the oxide pattern 5, a first and a second current blocking layer, for example a p-InP layer 12 and an n inP layer 13 are formed on the resulting structure.

Figure 8:
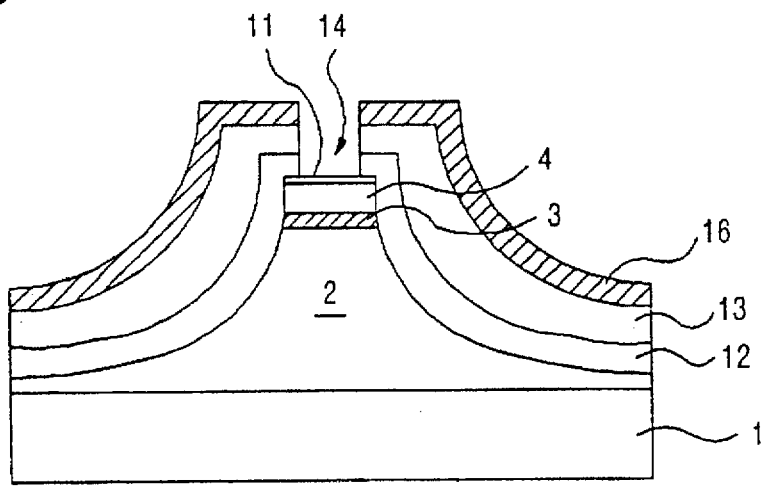

Next, referring to FIG. 8, after forming a predetermined photo resist pattern 16 on the resulting structure to expose the top of the mesa structure, an opening 14 is formed to expose the etch stop layer 11 by applying an anisotropic etching to the current blocking layers 12 and 13.

Figure 9:
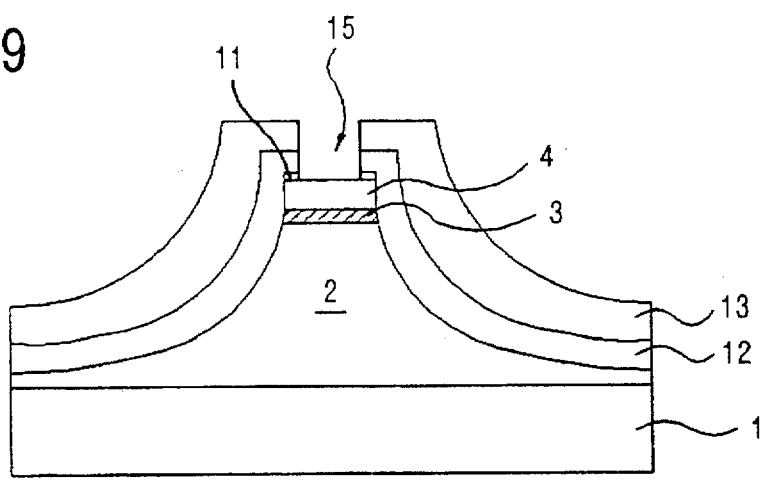

Next, referring to FIG. 9, after removing the photo resist pattern 16, the exposed etch stop layer 11 is removed and the current injecting opening 15 is formed.

Figure 10:
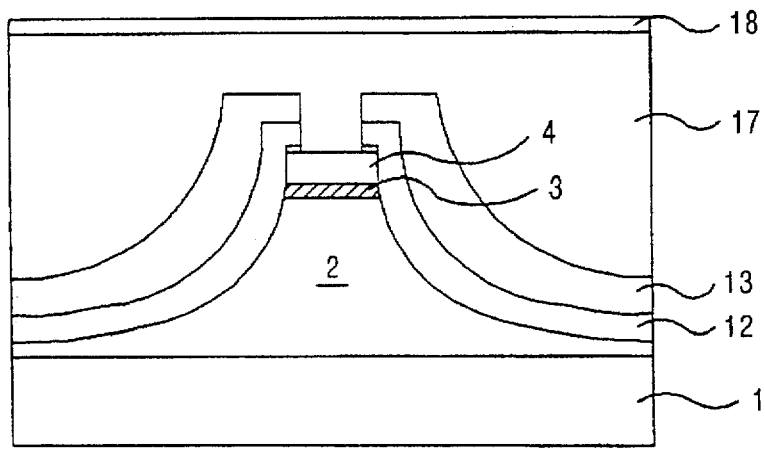

Finally, referring to FIG. 10, a first contact layer, for example a p-contact layer 17 is formed on the resulting structure, and a second contact layer 18 is formed on the p-contact layer 17.

As described above, according to the present invention, the current blocking layers 12 and 13 are formed to have improved profile without the effect of the process variations, for example the profile of etched mesa structure, the width of the under cut and the thickness of the current blocking layer. Also, a more controllable current injecting opening can be achieved by the anisotropic etching. These advantages result in the decrease of the leakage currents in the current blocking layers, whereby the device characteristics, the reliability and the reproducibility of process are improved.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method for fabricating a laser diode comprising the steps for:

successively forming a first clad layer, an active layer, a second clad layer and an etch stop layer on a semiconductor substrate;

forming an oxide pattern on said etch stop layer;

forming a mesa structure by etching a portion of said layers under said oxide pattern from said etch stop layer to a portion of said first clad layer using said oxide pattern as an etch mask;

removing said oxide pattern;

forming a first and a second current blocking layer on the resulting structure;

forming an opening to expose said etch stop layer by applying an anisotropic etching to said current blocking layers with a photo resist pattern;

removing said etch stop layer;

forming a first contact layer on the resulting structure; and forming a second contact layer on said first contact layer.

2. A method as claimed in claim 1, wherein said step fox forming an opening is performed by dry etching.

3. A method as claimed in claim 1, wherein said first clad layer is an n-InP clad layer.

4. A method as claimed in claim 1, wherein said second clad layer is a p-InP clad layer.

5. A method as claimed in claim 1, wherein said first current blocking layer is a p-InP layer.

6. A method as claimed in claim 1, wherein said second current blocking layer is an n-InP layer.

7. A method as claimed in claim 1, wherein said first contact layer is a p-contact layer.

8. A method as claimed in claim 1, wherein said second contact layer is a metal contact layer.

* * * * *

UNITED STATES PATENT AND TRADEMARK OFFICE
CERTIFICATE OF CORRECTION

PATENT NO. : 5,693,558
DATED : December 2, 1997
INVENTOR(S) : Lee et al.

It is certified that error appears in the above-identified patent and that said Letters Patent is hereby corrected as shown below:

"characteristics and reliability without the effect of the process variations, by forming current blocking layers on the resulting structure of the mesa structure and then forming an opening, through which currents are injected, in the current blocking layer.

In accordance with the present invention, there is disclosed a method for fabricating a laser diode including the steps for: successively forming a first clad layer, an active layer, a second clay layer and an etch stop layer; on a semiconductor substrate; forming an oxide pattern on the etch stop layer; forming a mesa structure by etching a predetermind portion of the layer under the oxide layer from the etch mask; removing the oxide pattern; forming a first and a second current blocking layer on the resulting structure; forming an opening to expose the etch stop layer by etching the current blocking layers with a predetermined photo resist pattern; removing the etch stop layer; forming a second contact layer on the first contact layer.

BRIEF DESCRIPTION OF THE DRAWINGS

A further understanding of the nature and advantage of the present invention will become apparent by reference to the remaining portions of the specification and drawing pattern. 5(refer to FIG. 2), a p-InP current blocking layer 6 and an n InP current blocking layer 7, are selectively formed on the side portion of the mesa strucure by MOCVD or LPE. In this case, the p-InP current blocking layer 6 is extended to the edge of the oxide pattern 5.

FIG. 4 B is a simplified cross sectional view which illustrates the occurrence of leakage currents through the current blocking layer 6 in FIG. 3B.

Referring to FIG. 4B, after removing the oxide pattern 5, the contact layer 8 is forming on the p-InP clad layer 4 and the n InP current blocking layer 7. Then, the metal contact layer 9 is formed on the p contact layer 8.

UNITED STATES PATENT AND TRADEMARK OFFICE
CERTIFICATE OF CORRECTION

PATENT NO. : 5,693,558
DATED : December 2, 1997
INVENTOR(S) : Lee et al.

It is certified that error appears in the above-identified patent and that said Letters Patent is hereby corrected as shown below:

The arrows 10 in the drawing denote the directions of the leakage current flow in the p-InP current blocking layer 6 due to the broader formation which is mentioned above with reference to FIG. 3B. The leakage current also results from the profile of the mesa structure, the size of the under cut and the thickness of the p-contact layer 8. These leakage currents from various sources deteriorate the characteristics, the reliability of the laser diode and the reproducibility of process.

SUMMARY OF THE INVENTION

Therefore, the present invention has been made in view of the above mentioned problems, and the present invention provides a method for fabricating a laser diode having improved device.

FIG.1 to 4 are simplified cross sectional views which illustrate the process flow of the conventional method.

FIG. 3B is a simplied cross sectional view which illustrates the different formation of the current blocking layer by the process variationsof the conventional method.

FIG. 4B is a simplied cross sectional view which illustrates the occurrence of leakage currents due to the current blocking layer in FIG. 3B.

FIGS. 5 to 10 are simplied cross sectional views which illustrate the process flow of the method for fabricating a laser diode according to the present invention.

and insert

-- pattern 5(refer to FIG. 2), a p-InP current blocking layer 6 and an n-InP current blocking layer 7, are selectively formed on the side portion of the mesa structure by MOCVD or LPE. In this case, the p-InP current layer 6 is extended to the edge of the oxide pattern 5.

FIG. 4 B is a simplified cross sectional view which illustrated the occurrence of leakage currents through the current blocking layer 6 in FIG. 3B.

UNITED STATES PATENT AND TRADEMARK OFFICE
CERTIFICATE OF CORRECTION

PATENT NO. : 5,693,558
DATED : December 2, 1997
INVENTOR(S) : Lee et al.

It is certified that error appears in the above-identified patent and that said Letters Patent is hereby corrected as shown below:

Referring to FIG. 4B, after removing the oxide pattern 5, the contact layer 8 is formed on the p-InP clad layer 4 and the n-InP current blocking layer 7. Then, the metal contact layer 9 is formed the p-contact layer 8.

The arrows 10 in the drawing denote the direction of the leakage current flow in the p-InP current blocking layer 6 due to the broader formation which is mentioned above with reference to FIG. 3B. The leakage current also results from the profile of the mesa structure, the size of the under cut and the thickness of the p-contact layer 8. These leakage currents from various deteriorate the characteristics, the reliability of the laser diode and the reproducibility of process.

SUMMARY OF THE INVENTION

Therefore, the present invention has been made in view of the above mentioned problem, and the present invention provides a method for fabricating a laser diode having improved device characteristics and reliability without the effect of the process variations, by forming current blocking layers on the resulting strucure of the mesa structure and then forming an opening, through which currents are injected, in the current blocking layer.

In accordance with the present invention, there is disclosed a method for fabricating a laser diode including he steps for: successively forming a first clad layer, an active layer, a second clad layer and an etch stop layer on a semiconductor sybstrate; forming an oxide pattern on the etch layer; forming a mesa structure by etching a predetermined portion of the layers under the oxide layer from the etch stop layer to a portion of the first clay layer using the oxide patten as an etch mask; removing the oxide pattern; forming a first and a second current blocking layer on the resulting structure; forming an opening to expose the etch stop layer by etching the current blocking layers with a predetermined photo resist pattern; removing the etch stop layer; forming a first contact layer on the resulting structure; and forming a second contact layer on the first contact layer.

BRIEF DESPRIPTION OF THE DRAWINGS

A further understanding of the nature and advantage of the present invention will become apparent by reference to the remaining portions of the specification and drawings.

UNITED STATES PATENT AND TRADEMARK OFFICE
CERTIFICATE OF CORRECTION

PATENT NO.   : 5,693,558
DATED        : December 2, 1997
INVENTOR(S)  : Lee et al.

It is certified that error appears in the above-identified patent and that said Letters Patent is hereby corrected as shown below:

FIGS. 1 to 4 are simplified cross sectional views which illustrate the process flow of the conventional method.

FIG. 3B is a simplied cross sectional view which illustrates the different formation of the current blocking layer by the process variations of the conventional method.

FIG. 4B is a simplied cross sectional view which illustrates the occurrence of leakage currents due to the current blocking layer in FIG. 3B.

FIGS. 5 to 10 are simplied cross sectional views which illustrate the process flow of the method for fabricating a laser diode according to the present invention.

Signed and Sealed this

Twenty-seventh Day of November, 2001

Attest:

NICHOLAS P. GODICI
*Attesting Officer*    *Acting Director of the United States Patent and Trademark Office*